United States Patent [19]
Motley et al.

[11] Patent Number: 5,646,809
[45] Date of Patent: Jul. 8, 1997

[54] HIGH VOLTAGE TOLERANT CMOS INPUT/OUTPUT PAD CIRCUITS

[75] Inventors: Gordon W. Motley; Peter J. Meier; David S. Maitland, all of Ft. Collins, Colo.

[73] Assignee: Hewlett-Packard Company, Palo Alto, Calif.

[21] Appl. No.: 520,218

[22] Filed: Aug. 28, 1995

[51] Int. Cl.$^6$ .................................................. H02H 9/00
[52] U.S. Cl. ................................................ 361/56; 361/111
[58] Field of Search .......................... 361/56, 111, 91; 326/21, 58

[56] References Cited

U.S. PATENT DOCUMENTS

| | | | |
|---|---|---|---|
| 5,140,174 | 8/1992 | Meier et al. | 327/171 |
| 5,319,259 | 6/1994 | Merrill | 361/91 |
| 5,400,202 | 3/1995 | Metz et al. | 361/56 |
| 5,452,171 | 9/1995 | Metz et al. | 361/56 |
| 5,550,699 | 8/1996 | Diaz | 361/56 |

OTHER PUBLICATIONS

Pending U.S. Pat. Application Ser No. 08/149858, to Metz, et al., for Electrostatic Discharge Protection Circuit for Integrated Circuits, Filed Nov. 10, 1993.

Pending U.S. Pat. Applications Ser. No. 08/290627, to Diaz, et al., for Hot Plug Tolerant ESD Protection for an IC, filed Aug. 15, 1994.

Pending U.S. Pat. Application Ser. No. 08/455473, to Motley, et al., for Compensating Programmable Output Driver, filed May 31, 1995.

Primary Examiner—Jeffrey A. Gaffin
Assistant Examiner—Sally C. Medley

[57] ABSTRACT

A high voltage tolerant CMOS output driver circuit and high voltage tolerant CMOS input receiver circuit, through the use of shield transistors and the redefinition of the substrate of the PFET devices, is provided. The invention may be incorporated for protection in integrated circuits operating with a lower power supply voltage than externally interfaced devices operating with a higher power supply voltage.

32 Claims, 3 Drawing Sheets

HIGH VOLTAGE TOLERANT CMOS INPUT/OUTPUT PAD CIRCUITS

FIELD OF THE INVENTION

The present invention relates generally to integrated circuit pad circuits, and more particularly to high voltage tolerant CMOS input/output pad circuits.

BACKGROUND OF THE INVENTION

Advanced Integrated Circuits (IC) fabrication processes, in their quest for integration density, high performance, reliable circuits, and low power, have recently taken a step to lower the voltage of the power supply needed to run the IC chips. Lowering this voltage allows the fabrication process to have smaller geometries and better performance without compromising the reliability or the quality of the integrated circuits.

One consequence of using the lower power supply voltage is the susceptibility of input and output pads to damage from external voltages higher than the power supply of the IC. This situation often occurs when an external device, which operates at a higher power supply voltage and which is electrically coupled to the input/output pad, drives the pad to a greater voltage than the power supply of the IC. The situation can also occur from transient spikes on the power supply of the IC. Damage results if excessive voltages occur across any two of the three terminals of the transistor (Gate, Source, Drain).

In addition, damage results to the gate oxide of a transistor due to hot carrier injection if it is allowed to draw large amounts of current from its drain to its source. Excessive voltages introduced across the source and drain of the transistor when the transistor is on allows excessive current to flow and results in permanent damage to the transistor.

A contextual example of the above situation may be seen in the migration of integrated circuits from 5 volts to 3.3 volts. As this migration takes place, applications are being built that have both 5 volts and 3.3 volts driving the same bus. This is possible since the logic levels driving and received by 5 volt and 3.3 volt chips are usually the same. For example, both 5 volt and 3.3 volt chips consider a logic "1" to be any voltage above 2.4 volts, while a logic "0" is any voltage below 0.4 volts. As a result of mixed IC applications, however, ICs powered by 3.3 volt sources need to be tolerant to the 5 volt signals. Since these signals can also be very high speed signals, the 3.3 volt chips must also be tolerant of the increased transmission line spikes and reflections caused by the increased speed.

SUMMARY OF THE INVENTION

It is an object of the invention to provide a circuit for allowing excessive voltages to be presented to an integrated circuit without causing damage to the pad transistors or creating a risk of reduced reliability or decreased quality.

The invention includes a high voltage tolerant CMOS output driver circuit, comprising three interrelated stages for driving an output pad low, driving the output pad high, and tri-stating the output pad.

The first stage is enabled when the high voltage tolerant CMOS output driver circuit is operating to drive the output pad low. It includes an inverter coupled to the gate of a first NFET device whose source is coupled to ground. The drain of the first NFET is coupled to the source of a second NFET. The gate of the second NFET is coupled to a chip power supply $V_{DD}$, thus ensuring that the voltage at its source never exceeds $V_{DD}-V_T$, where $V_T$ is the threshold voltage of the NFET device. In tri-state operation, the second NFET operates to shield the first stage from excessive voltages seen on the output pad.

The second stage is enabled when the high voltage tolerant CMOS output driver circuit is operating to drive the output pad high. The second stage includes an inverter coupled to the gate of a first PFET device. It also includes a third NFET device, having a source coupled to ground, and whose gate is coupled to the input of the inverter. The drain of the third NFET device is coupled to the source of a fourth NFET device, which has a gate coupled to the chip power supply $V_{DD}$, such that the voltage at its source never exceeds $V_{DD}-V_T$. The fourth NFET device thus operates as a shield to excessive voltages seen at its drain during tri-state mode. The drain of the fourth NFET device is coupled to the gate of a second PFET device, whose source is coupled to the chip power supply $V_{DD}$. The drain of the second PFET device is coupled to the source of the first PFET device, whose gate is coupled to the output of the inverter and whose drain is coupled to the output pad.

The third stage is required when the high voltage tolerant CMOS output driver circuit operates in tri-state mode. The third stage includes a third PFET device having a source coupled to the output pad, a gate coupled to the chip power supply $V_{DD}$, and a drain coupled to both the drain of the fourth NFET device and the gate of the second PFET device. In tri-state mode, the first and second stages are disabled, allowing an external device to drive the output pad. When the output pad is driven low externally, the first and third PFET devices are off, effectively isolating the output pad from the second stage. When the output pad is driven to a voltage $V_{DS}$, which exceeds $V_{DD}+V_T$, the first PFET device of the second stage turns on, driving the drain of the second PFET device to $V_{DS}$, potentially exposing it to overvoltage conditions due to a drain-to-gate voltage $V_{DG}>V_{DD}$. If the drain of the second PFET device is driven to $V_{DS}$, the second PFET device will turn on and cause current to flow from the output pad to the chip power supply through the first and second PFET devices. However, the present invention alleviates this problem, since simultaneously, the third PFET device turns on to drive the gate of the second PFET device to $V_{DS}$, thereby preventing the second PFET device from turning on. This ensures that none of the voltages across any two of its terminals exceeds $V_{DD}$, and that no current can flow from the output pad to the chip power supply through the first and second PFET devices.

In addition to the high voltage tolerant CMOS output driver circuit, the invention also includes a high voltage tolerant CMOS input receiver circuit. The receiver circuit includes an NFET device having a source coupled to the input pad, a gate coupled to the chip power supply $V_{DD}$, and a drain coupled to the input of an inverter. The NFET device operates as a shield for the receiver circuitry by allowing a maximum voltage of $V_{DD}-V_T$ at its drain node. As an enhancement to the high voltage tolerant CMOS input receiver circuit, a PFET device is inserted having a source coupled to the chip power supply $V_{DD}$, a drain coupled to both the drain of the NFET device and to the input of the inverter, and a gate coupled to the output of the inverter. The PFET operates as a pull up device to bring the logic level at the input of the inverter to high, or $V_{DD}$.

The voltage tolerance of the high voltage tolerant CMOS output driver circuit and high voltage tolerant CMOS input receiver circuit is accomplished using two novel techniques. First, the use of shield transistors which are always on prevent overvoltage conditions across any two terminals of any transistor in the pad circuit. Secondly, for the PFET devices, the backgate (N-well substrate) node, which is conventionally connected to the source of the device ($V_{DD}$), is redefined to a higher power supply $V_{DS}$. This allows the voltage of the drain of the PFET device to surpass $V_{DD}$ without forward biasing and causing excessive current flow into the N-well of the device.

BRIEF DESCRIPTION OF THE DRAWING

An illustrative and presently preferred embodiment of the invention is shown in the accompanying drawings in which.

DETAILED DESCRIPTION OF THE INVENTION

Figure 2:
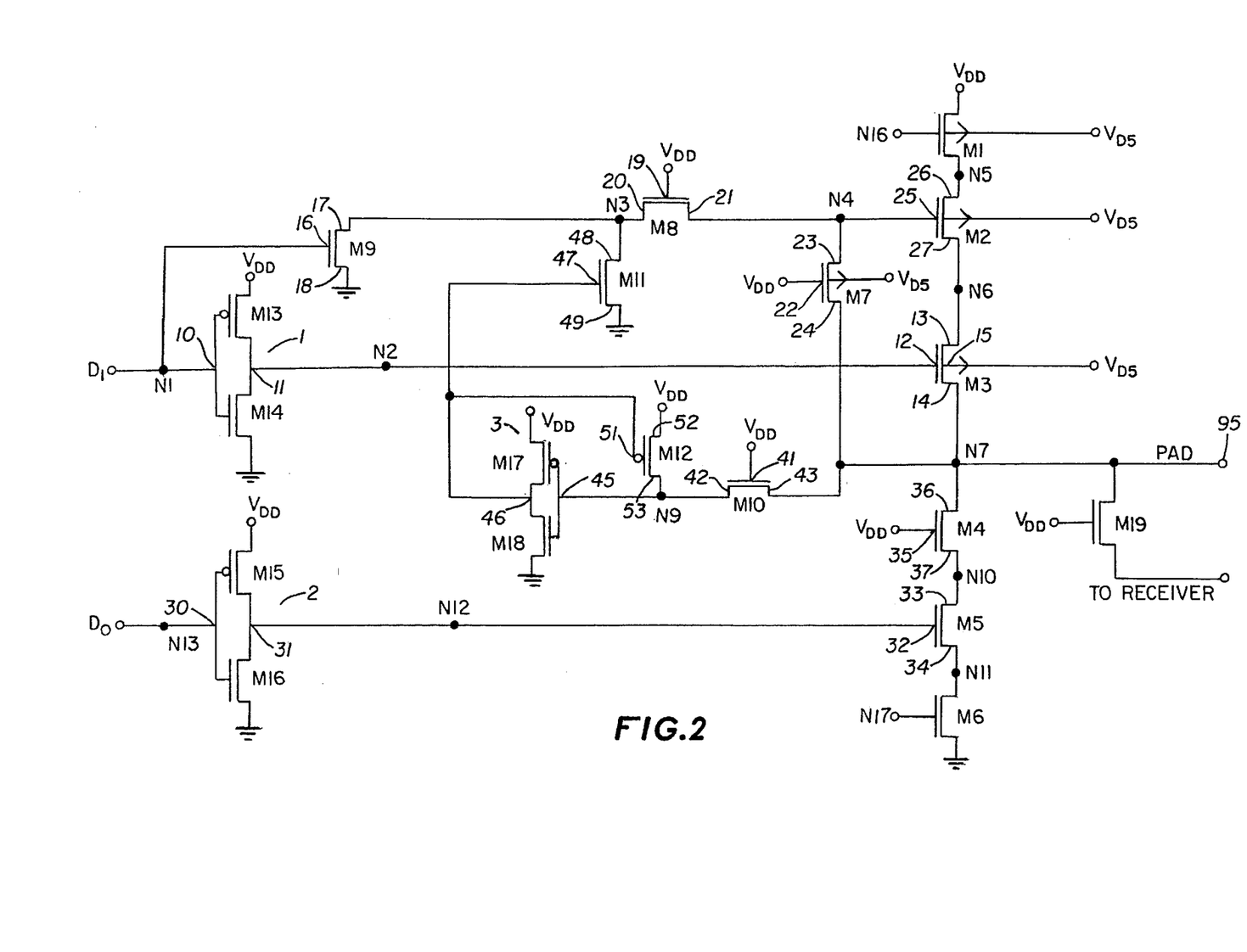
FIG. 2 is an alternative enhanced embodiment of the high voltage tolerant CMOS output driver circuit of FIG. 1.
Figure 3:
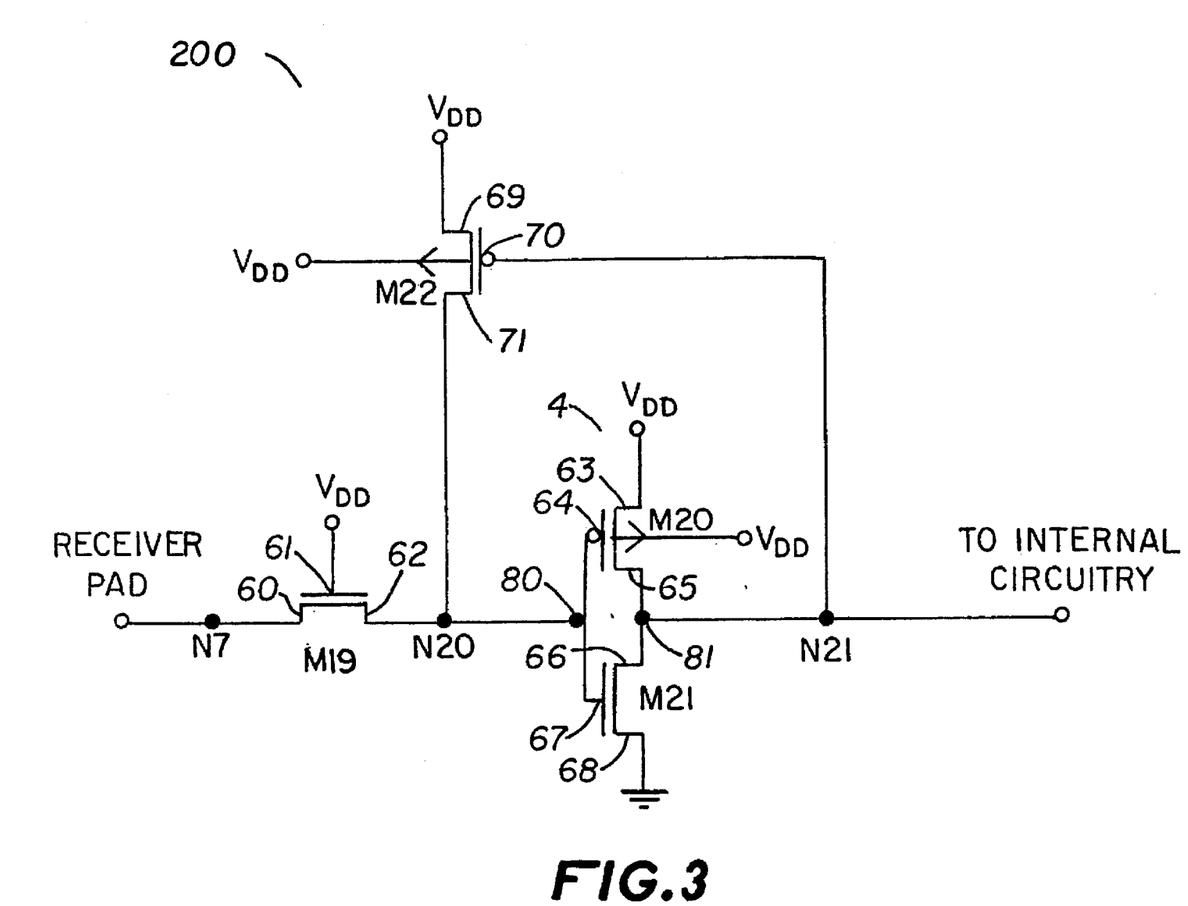
FIG. 3 is a schematic of the high voltage tolerant CMOS input receiver circuit of the present invention.

The drawing, in general, depicts high voltage tolerant CMOS input/output pad circuits in accordance with the present invention, and for use in applications requiring high voltage tolerant input/output pads. A high voltage tolerant CMOS output driver circuit 100 is shown in FIG. 1, with an enhanced embodiment shown in FIG. 2, and a high voltage tolerant CMOS input receiver circuit 200 is shown in FIG. 3.

1. Output Driver

Figure 1:
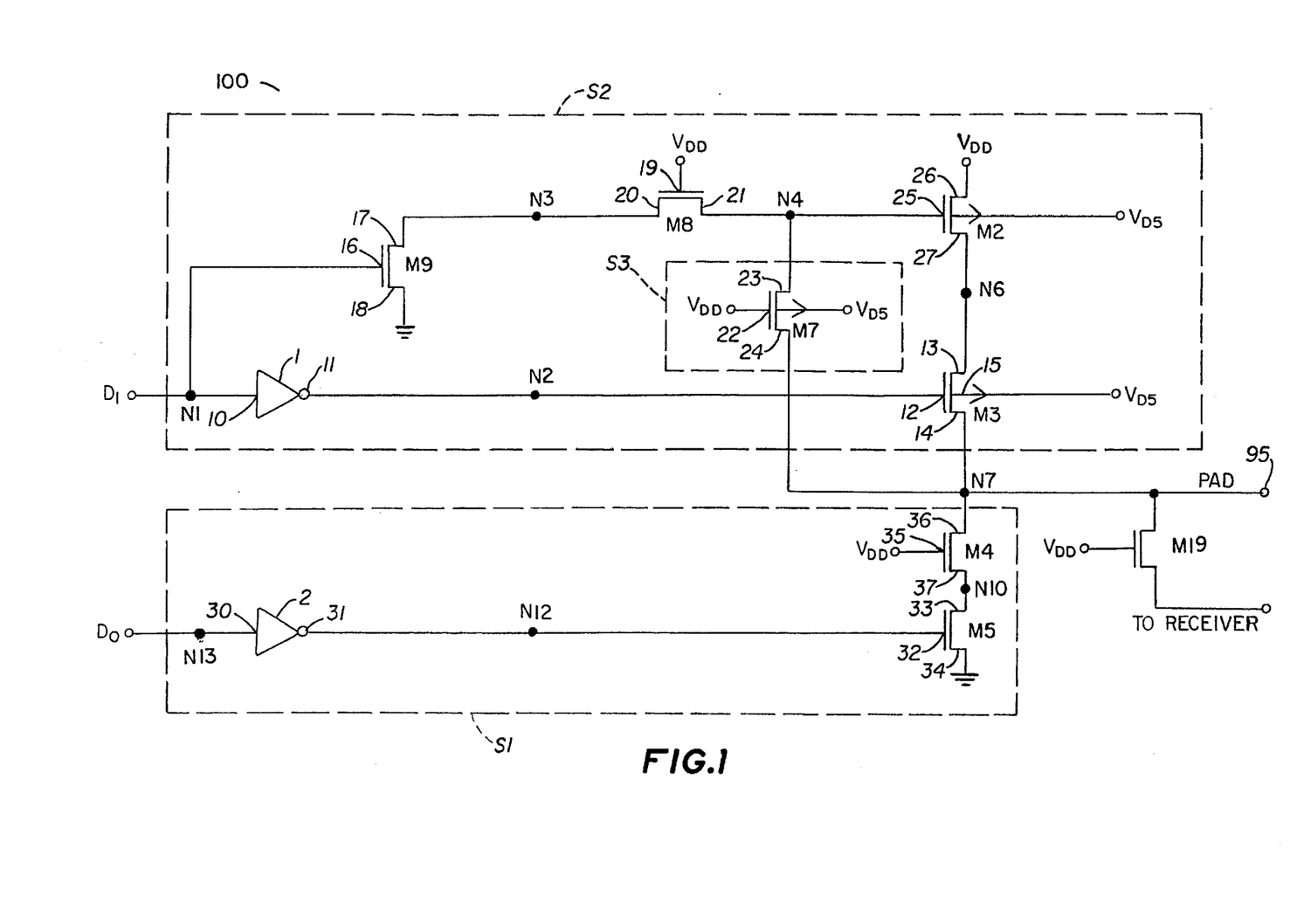
FIG. 1 is a schematic of the high voltage tolerant CMOS output driver circuit of the present invention.

Turning now in detail to the drawing, FIG. 1 depicts a high voltage tolerant CMOS output driver circuit 100 in accordance with the present invention. As will be described in detail hereinafter, the high voltage tolerant CMOS output driver circuit 100 of FIG. 1 provides the functionality for driving an output pad to one of three states; namely, low, high and inactive (tri-state). The functionality of the high voltage tolerant CMOS output driver circuit 100 may be divided into three functional stages: low stage S1, high stage S2 and tri-state stage S3.

Low stage S1 includes a first data input node N13 coupled to the input 30 of an inverter 2. In the preferred embodiment, inverter 2 is implemented using a complementary symmetry inverter, shown in FIG. 2, comprising a PFET device M15 and an NFET device M16. The output 31 of inverter 2 is coupled at node N12 to the gate 32 of a first NFET device M5. The first NFET device M5 has a source 34 coupled to ground and a drain 33 coupled at node N10 to the source 37 of a second NFET device M4. A supply voltage $V_{DD}$ is coupled to the gate 35 of the second NFET device M4. The drain 36 of the second NFET device M4 is coupled to a pad node N7.

High stage S2 includes a second data input node N1 coupled to the input 10 of an inverter 1. In the preferred embodiment, inverter 1 is implemented using a complementary symmetry inverter, shown in FIG. 2, comprising a PFET device M13 and an NFET device M14. The output 11 of inverter 1 is coupled at node N2 to the gate 12 of a first PFET device M3. The second data input node N1 is also coupled to the gate 16 of a third NFET device M9. The third NFET device M9 has a source 18 coupled to ground and a drain 17 coupled to the source 20 of a fourth NFET device M8. The fourth NFET device M8 has a gate 19 coupled to a supply voltage $V_{DD}$ and a drain 21 coupled to the gate 25 of a second PFET device M2. The second PFET device M2 has a source 26 coupled to a supply voltage $V_{DD}$ and a drain 27 coupled to the source 13 of the first PFET device M3. The drain 14 of the first PFET device M3 is coupled to the pad node N7.

Tri-state stage S3 includes a third PFET device M7 having a source 24 coupled to the pad node N7, a gate 22 coupled to a supply voltage $V_{DD}$, and a drain 23 coupled at node N4 to both the drain 21 of NFET device M8 and to the gate 25 of the second PFET device M2.

An important design feature of the high voltage tolerant CMOS output driver circuit 100 involves redefining the N-Well substrate of the PFET devices M2, M3 and M7 to a higher power supply of $V_{DS}$. Ordinarily in MOS devices, the substrate body of the device is coupled to the source internally. Thus, in the case of the PFETs, the substrate would ordinarily be coupled to the chip power supply $V_{DD}$. In the present invention, having the substrate, or backgate, of each of PFET devices M2, M3 and M7 coupled to a high power supply of $V_{DS}$ allows the voltage of the drains and sources of M2, M3 and M7 to exceed $V_{DD}$ without forward biasing and causing permanent damage to the transistor from excessive current flow into the N-well of the PFET. This situation will most likely happen when the high voltage tolerant CMOS output driver circuit 100 is operating in tri-state mode and an external device drives the output pad 95 to $V_{DS}$. However, it may also occur for short periods of time during some of the transients when the high voltage tolerant CMOS output driver circuit 100 is driving the output pad 95 to $V_{DD}$. One consequence of having the backgate of a PFET coupled to $V_{DS}$ and the source coupled to $V_{DD}$ is degradation of the drain-to-source current $I_{DS}$ of the transistor for a given $V_{GS}$, due to changing the channel formation by introducing a higher backgate voltage. The decrease in $I_{DS}$ can be overcome by increasing the size of the transistor.

The high voltage tolerant CMOS output driver circuit 100 operates in one of three states depending on the input data signals $D_0$ and $D_1$ received at nodes N13 and N1. When D0 and D1 are both low, the high voltage tolerant CMOS output driver circuit 100 drives the output pad 95 low. When D0 and D1 are both high, the output pad 95 is driven high. When D0 is high and D1 is low, the high voltage tolerant CMOS output driver circuit 100 is tri-stated. During tri-state operation, the high voltage tolerant CMOS output driver circuit 100 is protected against overvoltage conditions resulting from externally connected integrated circuits operating at a higher supply voltage.

In general, the high voltage tolerant CMOS output driver circuit 100 operates to receive a data input signal $D_0$ and $D_1$ at nodes N13 and N1, respectively. Low stage S1 receives input signal $D_0$ at node N13; high stage S2 and tri-state stage S3 receive input signal $D_1$ at node N1. Input data signals $D_0$ and $D_1$ are of a binary nature, low or high, receiving voltage levels of $V_{low}$ or $V_{high}$. In the preferred embodiment, $V_{low}$=0 volts, $V_{high}$=3.3 volts. Additionally, the NFETs and PFETs used in the high voltage tolerant CMOS output driver circuit 100 are each characterized by a threshold voltage $V_T$. In the preferred embodiment, the threshold voltage for NFETs is approximately $V_T \approx 0.7$ volts; for PFETs it is $V_T \approx 0.6$–$0.8$ volts.

a. Driving Low

When the high voltage tolerant CMOS output driver circuit 100 operates to drive the output pad 95 low, input data signals $D_0$ and $D_1$ will both be low; thus, N1 and N13 both have a potential of $V_{low}$. Low stage S1 performs the function of driving the output pad 95 low. $V_{low}$ is inverted to $V_{high}$ by inverter 2. Since the output 31 of inverter 2 is coupled at node N12 to the gate 32 of NFET M5, the gate 32 also has a potential of $V_{high}$. The source 34 of NFET M5 is coupled to ground, resulting in a gate-to-source voltage $V_{GS}$ of 3.3 volts ($V_{GS}=V_{high}=3.3$ V). Since $V_{GS}>V_T$, M5 turns on, driving node N10 and the source 37 of M4 to ground. Since the gate 35 of M4 is coupled to $V_{DD}$, the gate-to-source voltage $V_{GS}$ exceeds the threshold voltage $V_T$, and M4 turns on to drive the output pad 95 at pad node N7 to ground, or $V_{low}$.

When both $D_0$ and $D_1$ are low, high stage S2 is disabled as follows. Node N1, having potential $V_{low}$, is coupled to the input of inverter 1, which produces the inverted signal $V_{high}$ at output 11. The gate 12 of PFET M3 is coupled to the inverter 1 at node N2, and thus has a potential of $V_{high}$. Since the source 13 of PFET M3 will not exceed $V_{DD}+V_T$, PFET M3 is off and high stage S2 is disabled.

Tri-state stage S3 is similarly disabled when both $D_0$ and $D_1$ are low. Since the output pad 95, driven low ($V_{low}$) by low stage S1, is coupled at node N7 to the source 24 of PFET M7, the source 24 of PFET M7 will also be at potential $V_{low}$. Then, since the gate 22 of PFET M7 is coupled to the chip power supply $V_{DD}$, the positive gate-to-source voltage $V_{GS}$ forces M7 off, and thereby disabling tri-state stage S3.

b. Driving high

When the high voltage tolerant CMOS output driver circuit 100 operates to drive the output pad 95 high, input data signals $D_0$ and $D_1$ will both be high; thus, N1 and N13 both have a potential of $V_{high}$.

When node N1 has a potential of $V_{high}$, high stage S2 operates to drive the output pad node N7 high. Since N1 is coupled to the gate 16 of NFET M9, whose source 18 is coupled to ground ($V_{low}$), the gate-to-source voltage $V_{GS}$ exceeds $V_T$ and NFET M9 turns on, sinking current from the drain 17 to source 18, and driving node N3 to $V_{low}$. The source 20 of NFET M8 is coupled to the drain 17 of NFET M9 at node N3, which has a potential of $V_{low}$. The gate of NFET M8 is coupled to the chip power supply $V_{DD}$; since the gate-to-source voltage $V_{GS}$ exceeds $V_T$, M8 turns on, driving the gate 25 of PFET M2 at node N4 to $V_{low}$. Since the source 26 of PFET M2 is coupled to the chip power supply $V_{DD}$, the gate-to-source voltage $V_{GS}$ exceeds $V_T$, and PFET M2 turns on, driving the source 13 of PFET M3 to $V_{DD}=V_{high}$ at node N6. Meanwhile, the input 10 of the inverter 1, coupled at node N1 to receive data signal $D_1$, is at potential $V_{high}$. Inverter 1 inverts the signal, producing $V_{low}$ at its output 11, which is coupled at node N2 to the gate 12 of PFET M3. Since the source 13 of PFET M3 is at potential $V_{high}$, the gate-to-source voltage $V_{GS}$ exceeds $V_T$, and PFET M3 turns on, driving output pad node N7 to $V_{high}$.

The tri-state stage S3 is disabled when the high voltage tolerant CMOS output driver circuit 100 is operating to drive the output pad high as follows. The source 24 of PFET M7 is coupled to output pad node N7, which, as detailed above, is driven high to $V_{high}$ by high stage S2. Since the gate 22 of PFET M7 is coupled to the chip power supply $V_{DD}$, and the source voltage does not exceed $V_{DD}+V_T$; therefore, M7 is off, disabling the tri-state stage S3.

When node N13 has a potential of $V_{high}$, low stage S1 is disabled as follows. Node N13 is coupled to the input 30 of inverter 2, which produces an inverted signal $V_{low}$ at its output 31. Since output 31 is coupled to the gate 32 of NFET M5 at node N12, the gate-to-source voltage $V_{GS}$ at NFET M5 is zero, and NFET M5 is off. Since the gate 35 of NFET M4 is coupled to the chip power supply $V_{DD}$, NFET M4 is normally on, forcing node N10 to follow the voltage of pad node N7. However, when the voltage of pad node N7 reaches or exceeds a level defined by $V_{DD}-V_T$, NFET M4 reaches saturation, and the voltage at node N10 remains at $V_{DD}-V_T$. It will appreciated from the above discussion that NFET M4 operates as a shield, protecting the circuitry of low stage 1 from receiving a voltage greater than 3.6 V across any two terminals of any device.

c. Tri-state Mode

When the high voltage tolerant CMOS output driver circuit 100 operates in tri-state mode, low stage S1 and high stage S2 are disabled to allow another device to drive an external bus to which the output pad node N7 is coupled. In tri-state mode, input data signals $D_0$ and $D_1$ will be high and low, respectively; thus, N13 sees a potential of $V_{high}$ and N1 sees a potential of $V_{low}$.

The tri-state stage operates to protect the high voltage tolerant CMOS output driver circuit 100 from overvoltage conditions due to external devices. The external devices may operate with a chip power supply $V_{DS}$ higher than that corresponding to the chip power supply $V_{DD}$ of the high voltage tolerant CMOS output driver circuit 100. In the preferred embodiment $V_{DS}=5$ volts and $V_{DD}=3.3$ volts; thus, $V_{DS}>V_{DD}$. In order to prevent damage caused by the higher voltage $V_{DS}$, the tri-state stage S3 operates in conjunction with shield NFETs M4, M8 and M10 to ensure that no more than 3.6 volts exists across any two terminals of any device in the high voltage tolerant CMOS output driver circuit 100.

Since in tri-state mode input data $D_0$ is high, node N13 will see a potential of $V_{high}$. AS described in detail above, a potential of $V_{high}$ at node N13 disables NFET M5. Since the gate 35 of NFET M4 is coupled to the chip power supply $V_{DD}$, NFET M4 is on. If the voltage at pad node N7, coupled to the drain 36, exceeds $V_{DD}-V_T$, NFET M4 saturates; thus, node N10 will never exceed a voltage of $V_{DD}-V_T$, or ≈2.6 volts. NFET M4 is critical to the design of the high voltage tolerant CMOS output driver circuit 100 because it protects the devices in the output stage from experiencing overvoltage conditions (i.e., more than 3.6 volts, in the preferred embodiment) across any two terminals of any device in low stage 1 when the output pad 95 is driven to $V_{DS}$ or greater by external devices. From FIG. 1, if pad node N7 is driven externally to $V_{DS}$, M4 saturates, resulting in $V_{GS}=V_{DD}-V_T≈2.6$ volts, and $V_{DS}=V_{DS}-V_{GS}≈2.4$ volts for the preferred embodiment. With M4 on, node N10, coupled to the drain 33 of NFET M5, could experience a potential of $V_{DD}-V_T$; since the gate 32 has a potential of $V_{low}$ when the high voltage tolerant CMOS output driver circuit 100 is operating in the tri-state mode, M5 is off, resulting in a protected drain-to-source voltage $V_{DS}$ equal to $V_{DD}-V_T$.

In tri-state mode, data signal $D_1$ is low; thus, node N1 sees a potential of $V_{low}$. As described in detail above, a potential of $V_{low}$ at node N1 disables both PFET M3 and PFET M7 when the pad node N7 is less than $V_{DD}+V_T$, or ≈4 volts. In tri-state mode, however, an external device may drive the pad node N7 to $V_{DS}$, causing both M3 and M7 to source a current, driving nodes N4 and N6 to $V_{DS}$.

As seen from FIG. 1, NFET M8 operates as a shield to NFET M9; that is, without NFET M8, node N3 would be coupled to node N4, causing NFET M9 to experience overvoltage conditions with a drain-to-source voltage of $V_{DS}$. With shield NFET M8 in place, node N3 will see a maximum of $V_{DD}-V_T$, or ≈2.6 volts in the preferred embodiment. Thus, M9 will have a drain-to-source voltage of $V_{DD}-V_T$. NFET M8 will have a drain-to-source voltage of $V_{DS}-(V_{DD}-V_T)$, or ~2.4 volts in the preferred embodiment.

When pad node N7 sees a potential of $V_{DS}$, PFET M3 turns on, driving the drain 13 of M3 at node N6 to $V_{DS}$. The tri-state stage S3, including PFET M7, is needed in order to avoid overvoltage conditions across PFET M2 between nodes N5 and N6, and to prevent PFET devices M2 and M3 from sinking current from the output pad to $V_{DD}$. PFET M7 drives the gate 25 of PFET M2 up to $V_{DS}$, thereby protecting PFET M2 by reducing its gate-to-source voltage $V_{GS}$ to zero. PFET M7 also ensures that PFET M2 remains off and will not source current.

It will be appreciated from the preceding discussion that every device in the high voltage tolerant CMOS output driver circuit 100 is protected. This is achieved through the use of shield transistors which prevent both overvoltage conditions across any two terminals of any device and excessive current drawn from the output pad to $V_{DD}$ through M2 and M3. In addition, the substrates of the PFET devices are redefined to be $V_{DS}$ rather than $V_{DD}$ in order to allow the voltage on the drain of the PFET devices to exceed $V_{DD}$ without forward biasing, causing excessive current to flow, and resulting in damage to the gate oxide of the PFETs, or damaging them with hot carrier injection. FIG. 2 shows an alternative embodiment of the preferred invention, which is an enhanced version of the high voltage tolerant CMOS output driver circuit 100 shown in FIG. 1. In the embodiment shown in FIG. 2, two additional NFET devices, M10 and M11, and an inverter 3 are inserted in the high voltage tolerant CMOS output driver circuit. NFET M10 has a source 43 coupled to pad node N7, a gate 41 coupled to the chip power supply $V_{DD}$, and a drain 42 coupled to the input 45 of inverter 3 at node N9. Inverter 3 has an output 46 coupled to the gate 47 of NFET M11, whose source 49 is coupled to ground and drain 48 is coupled to node N3. In the preferred embodiment, inverter 3 is implemented using a CMOS inverter, comprising PFET device M17 and NFET device M18.

The purpose of the additional loop is to reduce delay time in discharging PFET M2 when operating in tri-state mode and an external device is driving the output pad 95 first high and then low. The loop including M10, inverter 3, and M11 operates to prepare to recharge after an external device drives the bus from high to low. When an external device drives the output pad 95 high to $V_{DS}$, PFET M7 operates to drive the gate 25 of M2 to $V_{DS}$. When the external device subsequently drives the output pad 95 low, the source 43 of NFET M10 receives $V_{low}$, turning M10 on and driving the gate 42 of M10 and input 45 of inverter 3 to $V_{low}$. The inverter 3 produces the inverted input signal $V_{high}$ at its output 46, which is coupled to the gate 47 of NFET M11, turning M11 on and driving the source 20 of M8 to $V_{low}$ at node N3. M8 is turned on and the gate 25 of M2 sees a potential of $V_{low}$, turning PFET M2 on and driving the source 13 of PFET M3 to $V_{DD}$ at node N6. Without this loop, when the output pad 95 is driven low by an external device, M7 and M3 are disabled. At the moment M7 and M3 are disabled, node N4 still has a potential of $V_{DS}$ and node N6 still has a potential of $\approx V_{DS}$. PFET M2 will slowly discharge until it turns off. The loop including M10, inverter 3 and M11 speeds up the discharge process by quickly placing $V_{low}$ on the gate 25 of M2.

An alternative embodiment includes an additional PFET device M12, as also seen in FIG. 2. PFET M12 removes undesirable static current caused by the inverter 3. As earlier mentioned, the inverter 3 in the loop including M10, inverter 3 and M11, is implemented with complementary symmetry devices PFET M17 and NFET M18. As will be noticed from FIG. 2, node N9 coupled to the input of inverter 3 will reach a maximum of $V_{DD}-V_T$ even when the output pad is driven to $V_{DS}$ by an external device, due to shield NFET M10. Because the input to inverter 3 is not a true high state $V_{DD}$, PFET device M17 will not be truly cutoff and NFET device M18 will not be truly saturated, resulting in a small static current flowing from $V_{DD}$ to ground in inverter 3. In order to remove this static current, an additional PFET device M12, having a source 52 coupled to the chip power supply $V_{DD}$, is introduced with its drain 53 coupled to the input 45 of inverter 3 and its gate 51 coupled to the output of inverter 3. The additional PFET M12 acts as a pull up transistor, pulling the input 45 of inverter 3 at node N9 from $V_{DD}-V_T$ up to $V_{DD}$, thus truly cutting off PFET M17 and truly saturating NFET M18.

An additional enhancement to the high voltage tolerant CMOS output driver circuit 100 is shown in FIG. 2 with the additional NFET device M6 and the additional PFET device M1. NFET M6 acts as a current limiting pull down transistor for maintaining a clean ground signal at node N11 for the source 34 of NFET M5, and for limiting the current that can be sunk by the driver. Similarly, PFET M1 acts as a current limiting pull up transistor for maintaining a clean chip supply source signal $V_{DD}$ at node N5 for the source 26 of PFET M2, and for limiting the current that can be sourced by the driver.

As an alternative to the current limiting devices, PFET M1 and NFET M6, a parallel FET current limiter ladder could be substituted, where the effective resistance of the ladder is digitally selectable through digital control of the gate voltages on each of the FET devices in the ladder. The FET sizes can be sized to supply typical currents of 2 mA, 4 mA, 8 mA, and so on.

2. Receiver

FIG. 3 shows a high voltage tolerant CMOS input receiver circuit 200 in accordance with the present invention. As seen in FIG. 3, the high voltage tolerant CMOS input receiver circuit 200 includes an NFET device M19 and an inverter 4. The NFET M19 has a source 60 coupled to the output pad 95 at pad node N7, a gate 61 coupled to the chip power supply signal $V_{DD}$, and a drain 62 coupled to the input 80 of inverter 4 at node N20. The output 81 of inverter 4 is coupled to input node N21 for use by the internal circuitry of the chip (not shown). In the preferred embodiment, the inverter 4 is implemented using a complementary symmetry inverter, comprising a PFET device M20 and an NFET device M21.

In the high voltage tolerant CMOS input receiver circuit 200, NFET M19 operates a shield device. Since the gate 61 is coupled to the chip power supply signal $V_{DD}$, node N20 coupled to the drain 62 of M19 will never exceed $V_{DD}-V_T$, even when the output pad 95 is driven to $V_{DS}$ by an external device. Thus, M19 protects the internal circuitry of the chip from overvoltage conditions.

An enhancement to the high voltage tolerant CMOS input receiver circuit 200 includes an additional PFET device M22. PFET M22 operates as a pull up transistor to boost node N20 from $V_{DD}-V_T$ to a true $V_{DD}$ for eliminating undesirable static current.

3. Combination driver/receiver.

In the preferred embodiment, both the high voltage tolerant CMOS output driver circuit 100 and the high voltage tolerant CMOS input receiver circuit 200 reside on the same output pad. The combination driver/receiver provides dual functionality for pads requiring both input and output, as for example, required of data lines in a data bus.

Based upon the foregoing detailed description, the present invention provides high voltage tolerant CMOS input/output pads for integrated circuits which can be exposed to overvoltage conditions without adverse effects on the quality, reliability or functionality of the integrated circuit. The high voltage tolerant CMOS input/output pad of the present invention is very useful for circuits requiring 0 and 3.3 volt power supplies, where the external world is operating on 0 and 5 volt power supplies.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A high voltage tolerant CMOS output driver circuit for an integrated circuit comprising:

a first low stage for driving an output pad node low and comprising a first inverter coupled to receive a first input data signal and to produce a first inverted signal; a first N-channel FET device having a source coupled to a chip ground and a gate coupled to receive the first inverted signal; and a second N-channel FET device having a source coupled to the drain of the first N-channel FET device, a gate coupled to a chip power supply, and a drain coupled to the output pad node;

a second high stage for driving the output pad high and comprising a second inverter coupled to receive a second input data signal and to produce a second inverted signal; a first P-channel FET device having a gate coupled to receive the second inverted signal, a drain coupled to the output pad node, a source, and a backgate coupled to a higher power supply, the higher power supply producing a voltage level higher than the chip power supply; a third N-channel FET device having a gate coupled to receive the second input data signal, a source coupled to the chip ground, and a drain; a fourth N-channel FET device having a source coupled to the drain of the third N-channel FET device, a gate coupled to the chip power supply, and a drain; a second P-channel FET device having a gate coupled to the drain of the fourth N-channel FET device, a backgate coupled to the higher power supply, a source coupled to the chip power supply, and a drain coupled to the source of the first P-channel FET device; and a third tri-state stage comprising a third P-channel FET device having a source coupled to the output pad node, a gate coupled to the chip power supply, a backgate coupled to the higher power supply, and a drain coupled to the drain of the fourth N-channel FET device and to the gate of the second P-channel FET device.

2. The high voltage tolerant CMOS output driver circuit of claim 1, said first inverter and said second inverter being complementary symmetry CMOS inverters, each comprising an inverter input node for receiving an input data signal; a P-channel FET device having a source coupled to the chip power supply, a gate coupled to the inverter input node, and a drain coupled to an inverter output node; and an N-channel FET device having a source coupled to the chip ground, a gate coupled to the inverter input node, and a drain coupled to the inverter output node.

3. The high voltage tolerant CMOS output driver circuit of claim 1, further comprising an enhanced delay-reduction circuit, said enhanced delay-reduction circuit comprising:

a fifth N-channel FET device having a source coupled to the output pad node, a gate coupled to the chip power supply, and a drain; a third inverter having an input coupled to the drain of the fifth N-channel FET device and having an output; and a sixth N-channel FET device having a gate coupled to the third inverter output, a source coupled to the chip ground, and a drain coupled to the drain of the third N-channel FET device and to the source of the fourth N-channel FET device.

4. The high voltage tolerant CMOS output driver circuit of claim 3, said enhanced delay-reduction circuit further comprising a pull up device for eliminating static current on the third inverter, wherein said pull up device is coupled between the chip power supply and the third inverter input.

5. The high voltage tolerant CMOS output driver circuit of claim 4, said pull up device comprising a fourth P-channel FET device having a source coupled to the chip power supply, a gate coupled to the third inverter output, and a drain coupled to the third inverter input.

6. The high voltage tolerant CMOS output driver circuit of claim 3, said enhanced delay-reduction circuit inverter being a complementary symmetry CMOS inverter, comprising an inverter input node for receiving an input data signal; a P-channel FET device having a source coupled to the chip power supply, a gate coupled to the inverter input node, and a drain coupled to an inverter output node; and an N-channel FET device having a source coupled to the chip ground, a gate coupled to the inverter input node, and a drain coupled to the inverter output node.

7. The high voltage tolerant CMOS output driver circuit of claim 6, said enhanced delay-reduction circuit further comprising a pull up device for eliminating static current on the third inverter, wherein said pull up device is coupled between the chip power supply and the third inverter input.

8. The high voltage tolerant CMOS output driver circuit of claim 7, said pull up device comprising a fourth P-channel FET device having a source coupled to the chip power supply, a gate coupled to the third inverter output, and a drain coupled to the third inverter input.

9. The high voltage tolerant CMOS output driver circuit of claim 1, further comprising a pull up device coupled between the chip power supply and the source of the second P-channel FET device, said pull up device operating as a current source for limiting current into the second P-channel FET device to a current limit.

10. The high voltage tolerant CMOS output driver circuit of claim 9, said pull up device comprising a P-channel FET device having a source coupled to the chip power supply, a drain coupled to the source of the second P-channel FET device, and a gate coupled to a reference voltage for setting the current limit.

11. The high voltage tolerant CMOS output driver circuit of claim 1, further comprising a pull down device coupled between the chip ground and the source of the first N-channel FET device, said pull down device operating as a current sink for limiting current into the first N-channel FET to a current limit.

12. The high voltage tolerant CMOS output driver circuit of claim 11, said pull down device comprising an N-channel FET device having a source coupled to the chip ground, a drain coupled to the source of the first N-channel FET device, and a gate coupled to a reference voltage for setting the current limit.

13. The high voltage tolerant CMOS output driver circuit of claim 1, further comprising:

an enhanced delay-reduction circuit comprising a fifth N-channel FET device having a source coupled to the output pad node, a gate coupled to the chip power supply, and a drain; a third inverter having an input coupled to the drain of the fifth N-channel FET device and having an output; a sixth N-channel FET device having a gate coupled to the third inverter output, a source coupled to the chip ground, and a drain coupled to the drain of the third N-channel FET device and to the source of the fourth N-channel FET device; and a pull up device for eliminating static current on the third inverter coupled between the chip power supply and the third inverter input;

a pull up device coupled between the chip power supply and the source of the second P-channel FET device, said pull up device operating as a current source for limiting current into the second P-channel FET device to a current limit; and a pull down device coupled between the chip ground and the source of the first N-channel FET device, said pull down device operating as a current sink for limiting current into the first N-channel FET to a current limit.

14. A high voltage tolerant CMOS bidirectional driver/receiver circuit for an integrated circuit comprising:

a first output driver low stage for driving an output pad node low and comprising a first inverter coupled to receive a first input data signal and to produce a first inverted signal; a first N-channel FET device having a source coupled to a chip ground and a gate coupled to receive the first inverted signal; and a second N-channel FET device having a source coupled to the drain of the first N-channel FET device, a gate coupled to a chip power supply, and a drain coupled to the output pad node;

a second output driver high stage for driving the output pad high and comprising a second inverter coupled to receive a second input data signal and to produce a second inverted signal; a first P-channel FET device having a gate coupled to receive the second inverted signal, a drain coupled to the output pad node, a source, and a backgate coupled to a higher power supply, the higher power supply producing a voltage level higher than the chip supply; a third N-channel FET device having a gate coupled to receive the second input data signal, a source coupled to the chip ground, and a drain; a fourth N-channel FET device having a source coupled to the drain of the third N-channel FET device, a gate coupled to the chip power supply, and a drain; a second P-channel FET device having a gate coupled to the drain of the fourth N-channel FET device, a backgate coupled to the higher power supply, a source coupled to the chip power supply, and a drain coupled to the source of the first P-channel FET device;

a third output driver tri-state stage comprising a third P-channel FET device having a source coupled to the output pad node, a gate coupled to the chip power supply, a backgate coupled to the higher power supply, and a drain coupled to the drain of the fourth N-channel FET device and to the gate of the second P-channel FET device; and a receiver stage comprising a seventh N-channel FET device having a source coupled to an input pad node, a gate coupled to the chip power supply, and a drain; and a receiver inverter having an input coupled to the drain of the seventh N-channel FET device and an output coupled to a receiver node and for producing an inverted-logic receive signal for use by internal circuitry of the integrated circuit.

15. The high voltage tolerant CMOS bidirectional driver/receiver circuit of claim 14, wherein said first inverter, said second inverter, and said receiver inverter being complementary symmetry CMOS inverters, each comprising an inverter input node for receiving an input data signal; a P-channel FET device having a source coupled to the chip power supply, a gate coupled to the inverter input node, and a drain coupled to an inverter output node; and an N-channel FET device having a source coupled to the chip ground, a gate coupled to the inverter input node, and a drain coupled to the inverter output node.

16. The high voltage tolerant CMOS bidirectional driver/receiver circuit of claim 14, further comprising an enhanced delay-reduction circuit, said enhanced delay-reduction circuit comprising:

a fifth N-channel FET device having a source coupled to the output pad node, a gate coupled to the chip power supply, and a drain; a third inverter having an input coupled to the drain of the fifth N-channel FET device and having an output; and a sixth N-channel FET device having a gate coupled to the third inverter output, a source coupled to the chip ground, and a drain coupled to the drain of the third N-channel FET device and to the source of the fourth N-channel FET device.

17. The high voltage tolerant CMOS bidirectional driver/receiver circuit of claim 16, said enhanced delay-reduction circuit further comprising a pull up device for eliminating static current on the third inverter, said pull up device being coupled between the chip power supply and the third inverter input.

18. The high voltage tolerant CMOS bidirectional driver/receiver circuit of claim 17, said pull up device comprising a fourth P-channel FET device having a source coupled to the chip power supply, a gate coupled to the third inverter output, and a drain coupled to the third inverter input.

19. The high voltage tolerant CMOS bidirectional driver/receiver circuit of claim 16, said enhanced delay-reduction circuit inverter being a complementary symmetry CMOS inverter, comprising an inverter input node for receiving an input data signal; a P-channel FET device having a source coupled to the chip power supply, a gate coupled to the inverter input node, and a drain coupled to an inverter output node; and an N-channel FET device having a source coupled to the chip ground, a gate coupled to the inverter input node, and a drain coupled to the inverter output node.

20. The high voltage tolerant CMOS bidirectional driver/receiver circuit of claim 19, said enhanced delay-reduction circuit further comprising a pull up device for eliminating static current on the third inverter, wherein said pull up device is coupled between the chip power supply and the third inverter input.

21. The high voltage tolerant CMOS bidirectional driver/receiver circuit of claim 20, said pull up device comprising a fourth P-channel FET device having a source coupled to the chip power supply, a gate coupled to the third inverter output, and a drain coupled to the third inverter input.

22. The high voltage tolerant CMOS bidirectional driver/receiver circuit of claim 16, further comprising a pull up device for eliminating static current on the third inverter, said pull up device being coupled between the chip power supply and the third inverter input.

23. The high voltage tolerant CMOS bidirectional driver/receiver circuit of claim 22, said pull up device comprising a P-channel FET device having a source coupled to the chip power supply, a gate coupled to the third inverter output, and a drain coupled to the third inverter input.

24. The high voltage tolerant CMOS bidirectional driver/receiver circuit of claim 14, further comprising a pull up device coupled between the chip power supply and the source of the second P-channel FET device, said pull up device operating as a current source for limiting current into the second P-channel FET device to a current limit.

25. The high voltage tolerant CMOS bidirectional driver/ receiver circuit of claim 24, said pull up device comprising a P-channel FET device having a source coupled to the chip power supply, a drain coupled to the source of the second P-channel FET device, and a gate coupled to a reference voltage for setting the current limit.

26. The high voltage tolerant CMOS bidirectional driver/ receiver circuit of claim 14, further comprising a pull down device coupled between the chip ground and the source of the first N-channel FET device, said pull down device operating as a current sink for limiting current into the first N-channel FET to a current limit.

27. The high voltage tolerant CMOS bidirectional driver/ receiver circuit of claim 26, said pull down device comprising an N-channel FET device having a source coupled to the chip ground, a drain coupled to the source of the first N-channel FET device, and a gate coupled to a reference voltage for setting the current limit.

28. A high voltage tolerant CMOS bidirectional driver/ receiver circuit for an integrated circuit comprising:

a first output driver stage for driving an output pad node low and comprising a first inverter coupled to receive a first input data signal and to produce a first inverted signal; a first N-channel FET device having a source coupled to a chip ground and a gate coupled to receive the first inverted signal; and a second N-channel FET device having a source coupled to the drain of the first N-channel FET device, a gate coupled to a chip power supply, and a drain coupled to the output pad node;

a second output driver high stage for driving the output pad node high and comprising a second inverter coupled to receive a second input data signal and to produce a second inverted signal; a first P-channel FET device having a gate coupled to receive the second inverted signal, a drain coupled to the output pad node, a source, and a backgate coupled to a higher power supply, the higher power supply producing a voltage level higher than the chip power supply; a third N-channel FET device having a gate coupled to receive the second input data signal, a source coupled to the chip ground, and a drain; a fourth N-channel FET device having a source coupled to the drain of the third N-channel FET device, a gate coupled to the chip power supply, and a drain; a second P-channel FET device having a gate coupled to the drain of the fourth N-channel FET device, a backgate coupled to the higher power supply, a source coupled to the chip power supply, and a drain coupled to the source of the first P-channel FET device;

a third output driver tri-state stage comprising a third P-channel FET device having a source coupled to the output pad node, a gate coupled to the chip power supply, a backgate coupled to the higher power supply, and a drain coupled to the drain of the fourth N-channel FET device and to the gate of the second P-channel FET device;

an enhanced delay-reduction circuit, said enhanced delay-reduction circuit comprising a fifth N-channel FET device having a source coupled to the output pad node, a gate coupled to the chip power supply, and a drain; a third inverter having an input coupled to the drain of the fifth N-channel FET device and having an output; and a sixth N-channel FET device having a gate coupled to the third inverter output, a source coupled to the chip ground, and a drain coupled to the drain of the third N-channel FET device and to the source of the fourth N-channel FET device; and a pull up device for eliminating static current on the third inverter, said pull up device being coupled between the chip power supply and the third inverter input;

a receiver stage comprising a seventh N-channel FET device having a source coupled to an input pad node, a gate coupled to the chip power supply, and a drain; and a receiver inverter having an input coupled to the drain of the seventh N-channel FET device and an output coupled to a receiver node and for producing an inverted-logic receive signal for use by internal circuitry of the integrated circuit.

29. A high voltage tolerant CMOS pull-up circuit for driving to a logic level high an output pad node of an integrated circuit comprising:

an inverter coupled to receive an input enabling signal and to produce an inverted signal; a first P-channel FET device having a gate coupled to receive the inverted signal, a drain coupled to the output pad node, a source, and a backgate coupled to a higher power supply, the higher power supply producing a voltage level higher than the chip power supply; a first N-channel FET device having a gate coupled to receive the input enabling signal, a source coupled to the chip ground, and a drain; a second N-channel FET device having a source coupled to the drain of the first N-channel FET device, a gate coupled to the chip power supply, and a drain; a second P-channel FET device having a gate coupled to the drain of the second N-channel FET device, a backgate coupled to the higher power supply, a source coupled to the chip power supply, and a drain coupled to the source of the first P-channel FET device; and a third P-channel FET device having a source coupled to the output pad node, a gate coupled to the chip power supply, a backgate coupled to the higher power supply, and a drain coupled to the drain of the second N-channel FET device and to the gate of the second P-channel FET device.

30. The high voltage tolerant CMOS pull-up circuit of claim 29, further comprising an enhanced delay-reduction circuit, said enhanced delay-reduction circuit comprising:

a third N-channel FET device having a source coupled to the output pad node, a gate coupled to the chip power supply, and a drain; an enhanced delay-reduction circuit inverter having an input coupled to the drain of the third N-channel FET device and having an output; and a fourth N-channel FET device having a gate coupled to the third inverter output, a source coupled to the chip ground, and a drain coupled to the drain of the first N-channel FET device and to the source of the second N-channel FET device.

31. The high voltage tolerant CMOS pull-up circuit of claim 30, said enhanced delay-reduction circuit further comprising a pull up device for eliminating static current on the enhanced delay-reduction circuit inverter, wherein said pull up device is coupled between the chip power supply and the enhanced delay-reduction circuit inverter input.

32. The high voltage tolerant CMOS pull-up circuit of claim 31, said pull up device comprising a P-channel FET device having a source coupled to the chip power supply, a gate coupled to the enhanced delay-reduction circuit inverter output, and a drain coupled to the enhanced delay-reduction circuit inverter input.

* * * * *